United States Patent
Yu et al.

(10) Patent No.: US 9,477,038 B2
(45) Date of Patent: Oct. 25, 2016

(54) PHOTOELECTRIC COMPOSITE WIRING MODULE

(71) Applicant: HITACHI CABLE, LTD., Tokyo (JP)

(72) Inventors: Juhyun Yu, Mito (JP); Hiroki Yasuda, Mito (JP); Kouki Hirano, Hitachinaka (JP); Hiroshi Ishikawa, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 340 days.

(21) Appl. No.: 13/763,782

(22) Filed: Feb. 11, 2013

(65) Prior Publication Data

US 2013/0209027 A1    Aug. 15, 2013

(30) Foreign Application Priority Data

Feb. 15, 2012 (JP) .................. 2012-030680

(51) Int. Cl.
| | |
|---|---|
| G02B 6/12 | (2006.01) |
| G02B 6/42 | (2006.01) |
| G02B 6/43 | (2006.01) |
| G02B 6/44 | (2006.01) |
| H05K 1/11 | (2006.01) |

(52) U.S. Cl.
CPC ............... *G02B 6/12* (2013.01); *G02B 6/428* (2013.01); *G02B 6/43* (2013.01); *G02B 6/4202* (2013.01); *G02B 6/4214* (2013.01); *G02B 6/4239* (2013.01); *G02B 6/4245* (2013.01); *G02B 6/4416* (2013.01); *H05K 1/118* (2013.01); *H05K 2201/0108* (2013.01); *H05K 2201/10121* (2013.01)

(58) Field of Classification Search
None
See application file for complete search history.

(56) References Cited

U.S. PATENT DOCUMENTS

| | | | |
|---|---|---|---|
| 6,203,212 B1* | 3/2001 | Rosenberg et al. | 385/92 |
| 6,754,406 B2* | 6/2004 | Kaneshiro et al. | 385/14 |
| 8,363,993 B2* | 1/2013 | Yu et al. | 385/101 |
| 2006/0067608 A1* | 3/2006 | Kobayashi et al. | 385/14 |
| 2006/0192278 A1* | 8/2006 | Furuyama et al. | 257/686 |
| 2007/0019914 A1* | 1/2007 | Ohtsu | G02B 6/43 385/89 |
| 2008/0003840 A1* | 1/2008 | Sontage et al. | 439/55 |
| 2008/0152286 A1* | 6/2008 | Ueno et al. | 385/101 |
| 2008/0226222 A1* | 9/2008 | Kim et al. | 385/14 |
| 2009/0180733 A1* | 7/2009 | Hwang et al. | 385/14 |
| 2010/0028017 A1* | 2/2010 | Mizoguchi | 398/141 |
| 2011/0052205 A1* | 3/2011 | Yu et al. | 398/142 |
| 2012/0051697 A1* | 3/2012 | Kadar-Kallen et al. | 385/78 |
| 2012/0243833 A1* | 9/2012 | Shimotsu et al. | 385/77 |

FOREIGN PATENT DOCUMENTS

JP        2011-053269 A     3/2011

* cited by examiner

*Primary Examiner* — Tina Wong
(74) *Attorney, Agent, or Firm* — Roberts Mlotkowski Safran Cole & Calderon, PC

(57) ABSTRACT

A photoelectric composite wiring module includes a flexible first substrate including a conductive line and an optical fiber mounted thereon along a longitudinal direction thereof, a second substrate including a recessed portion formed thereon to receive the conductive line and the optical fiber that protrude from an end portion of the first substrate, and an optical device mounted on the second substrate and optically coupled to the optical fiber. The recessed portion includes an opening on a mounting surface side of the second substrate to mount the optical device.

10 Claims, 7 Drawing Sheets

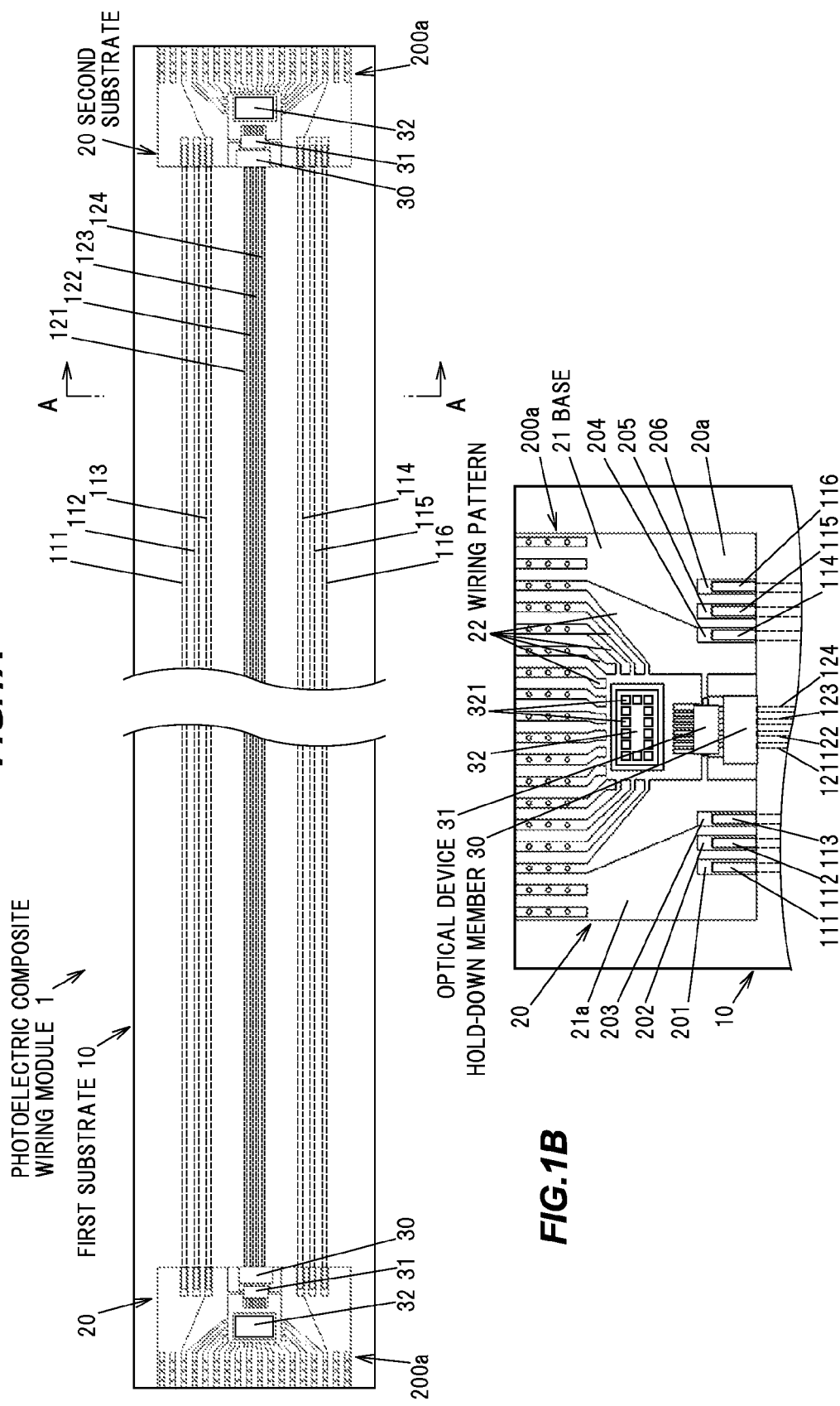

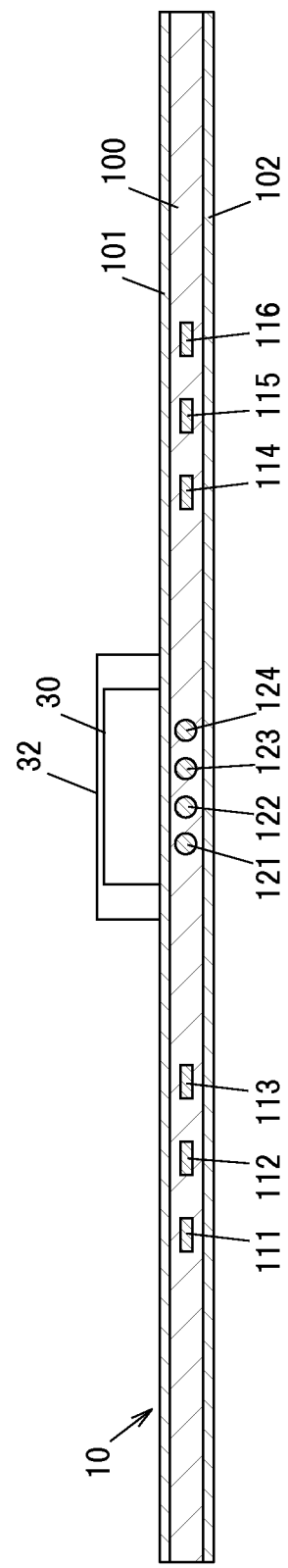

PHOTOELECTRIC COMPOSITE WIRING MODULE

The present application is based on Japanese patent application No. 2012-030680 filed on Feb. 15, 2012, the entire contents of which are incorporated herein by reference.

BACKGROUND OF THE INVENTION

1. Field of the Invention

The invention relates to a photoelectric composite wiring module which transmits signals through a conductive line and an optical fiber.

2. Description of the Related Art

A conventional photoelectric composite wiring module is known in which a flat cable having an optical transmission line and an electric wiring is optically and electrically connected to a pair of printed-circuit boards at both longitudinal ends (see JP-A-2011-53269).

In the photoelectric composite wiring module described in JP-A-2011-53269, an optical transmitter module composed of a light-emitting element and a driver IC is mounted on one of the paired printed-circuit boards and an optical receiver module composed of a light-receiving element and a preamplifier IC is mounted on another printed-circuit board.

A groove for the optical transmission line and a groove for the electric wiring are formed on one surface of each printed-circuit board. The groove for the optical transmission line receives an optical fiber as the optical transmission line protruding from an end portion of the flat cable, and the groove for the electric wiring receives the electric wiring protruding from the end portion of the flat cable. Meanwhile, the optical transmitter module or the optical receiver module is mounted on another surface of the printed-circuit board.

In addition, an optical waveguide is formed on the printed-circuit board so as to continue to the groove for the optical transmission line. A reflective portion is formed on the optical waveguide so as to reflect light emitted from the light-emitting element toward the optical fiber or light emitted from the optical fiber toward the light-receiving element. In addition, the reflective portion is formed on a surface of the printed-circuit board opposite to the surface mounting the light-emitting element or the light-receiving element so as to have a groove shape across the printed-circuit board. The light emitted from the light-emitting element or the optical fiber is reflected by the reflective portion and reaches the optical fiber or the light-emitting element after transmitting through the printed-circuit board.

SUMMARY OF THE INVENTION

In the photoelectric composite wiring module described in JP-A-2011-53269, since the surface of the printed-circuit board on which the groove for the optical transmission line and the groove for the electric wiring are formed is different from the surface mounting the optical transmitter module or the optical receiver module, work of receiving and fixing the optical fiber and the electric wiring into the groove for the optical transmission line and the groove for the electric wiring and work of mounting the optical transmitter module or the optical receiver module need to be carried out from both sides of the printed-circuit board. Thus, it is necessary to flip over the printed-circuit board, e.g., after mounting the optical transmitter module or the optical receiver module on the printed-circuit board and then to receive and fix the optical fiber and the electric wiring, which increases man-hours.

Accordingly, it is an object of the invention to provide a photoelectric composite wiring module which allows assembly man-hours to be reduced as compared to the case where grooves for receiving an optical fiber and an electric wiring are formed on surface on the reverse side of a surface mounting an optical device (light-emitting element or light-receiving element).

(1) According to one embodiment of the invention, a photoelectric composite wiring module comprises:

a flexible first substrate comprising a conductive line and an optical fiber mounted thereon along a longitudinal direction thereof;

a second substrate comprising a recessed portion formed thereon to receive the conductive line and the optical fiber that protrude from an end portion of the first substrate; and an optical device mounted on the second substrate and optically coupled to the optical fiber, wherein the recessed portion comprises an opening on a mounting surface side of the second substrate to mount the optical device.

In the above embodiment (1) of the invention, the following modifications and changes can be made.

(i) The second substrate comprises a base formed of an insulating resin and having the recessed portions formed thereon and wiring patterns provided on a first principal surface of the base on the mounting surface side and on a second principal surface opposite to the first principal surface, wherein the base comprises a reflecting surface inclined relative to the first principal surface at an edge of the recessed portion receiving the optical fiber, and wherein the optical fiber is optically coupled to the optical device through the reflecting surface.

(ii) The conductive line comprises a plurality of conductive lines, wherein at least one of the plurality of the conductive lines is received in the recessed portion penetrating the base from the first principal surface to the second principal surface and is electrically connected to the wiring pattern on the second principal surface side.

(iii) The base further comprises an injection hole for injecting an adhesive to fix the optical device to the second substrate, wherein the injection hole is separated from the recessed portion by a partition wall having the reflecting surface.

(iv) The recessed portion comprises a wide portion having a width matching an outer diameter of the optical fiber and a narrow portion having a width narrower than the outer diameter of the optical fiber, wherein a step portion between the wide portion and the narrow portion is formed on the mounting surface outside of a region for mounting the optical device.

(v) The photoelectric composite wiring module further comprises:

a hold-down member fixed to the mounting surface of the second substrate to hold-down the optical fiber that is received in the wide portion of the recessed portion, wherein the hold-down member has translucency allowing the recessed portion to be visible from a position in a normal direction of the mounting surface while being fixed to the mounting surface.

Points of the Invention

According to one embodiment of the invention, a photoelectric composite wiring module is constructed such that the recessed portions (for receiving conductive lines) and the optical fiber receiving recesses (for receiving optical fibers) each have an opening on the mounting surface (i.e., only one surface) of the second substrate. Thereby, a work to receive and fix the conductive lines into the recessed portions, a work to receive and fix the optical fibers in the optical fiber receiving recesses and a work to mount the optical device and the semiconductor circuit element can be all carried out on the mounting surface side of the second substrate. Thus, it is not necessary to turn over the second substrate through the above works.

BRIEF DESCRIPTION OF THE DRAWINGS

Next, the present invention will be explained in more detail in conjunction with appended drawings, wherein:

FIGS. 1A and 1B are plan views showing a photoelectric composite wiring module in the present embodiment as viewed from one surface side;

FIG. 3 is a cross sectional view taken on line A-A in FIG. 1A, showing a cross section of a first substrate of the photoelectric composite wiring module;

DETAILED DESCRIPTION OF THE PREFERRED EMBODIMENTS

A structural example of a photoelectric composite wiring module in the embodiment of the invention will be described below in reference to FIGS. 1A to 7.

Figure 2A:
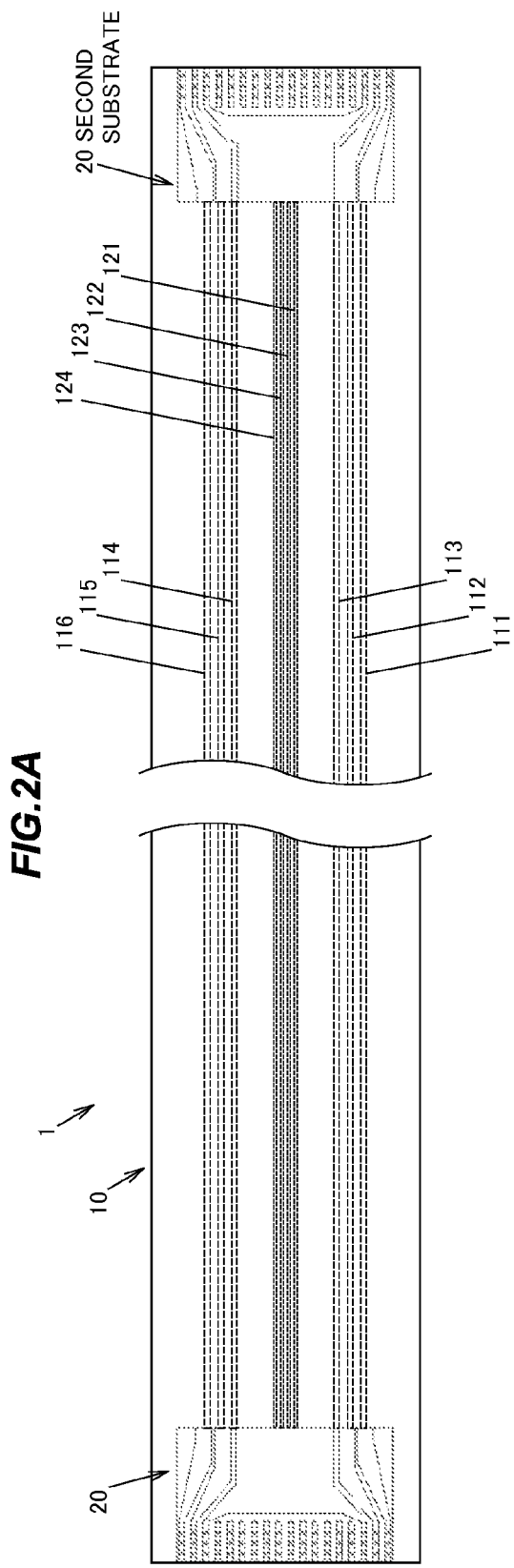
FIGS. 2A and 2B are plan views showing the photoelectric composite wiring module shown in FIG. 1 as viewed from another surface side.
Figure 2B:
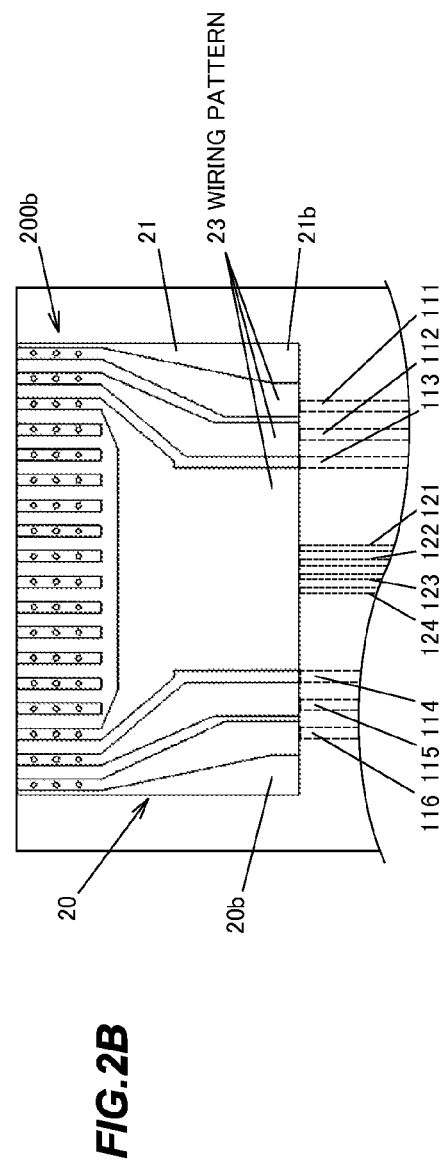

FIGS. 1A and 1B are plan views showing a photoelectric composite wiring module 1 in the present embodiment as viewed from one surface side. FIGS. 2A and 2B are plan views showing the photoelectric composite wiring module 1 shown in FIG. 1 as viewed from another surface side.

The photoelectric composite wiring module 1 is provided with a long first substrate 10, a pair of second substrates 20 connected to both end portions of the first substrate 10, and an optical device 31 and a semiconductor circuit element 32 which are mounted on each second substrate 20.

The first substrate 10 is a flat cable with flexibility having first to sixth conductive lines 111 to 116 and first to fourth optical fibers 121 to 124 provided along a longitudinal direction thereof. The first to fourth optical fibers 121 to 124 are optically coupled to each of the optical devices 31 mounted on the pair of second substrates 20. The first substrate 10 has a length of, e.g., 20 cm to 3 m and a lateral width of, e.g., 3 to 20 cm. In FIGS. 1A and 2A, illustration of the longitudinal middle portion of the first substrate 10 is omitted to show both end portions thereof.

FIG. 3 is a cross sectional view taken on line A-A in FIG. 1A, showing a cross section of the first substrate 10. The first substrate 10 is provided with front and back laminated layers 101 and 102, and an adhesive layer 100 provided therebetween. The first to sixth conductive lines 111 to 116 and the first to fourth optical fibers 121 to 124 are arranged parallel to each other between the front laminated layer 101 and the back laminated layer 102. The first to fourth optical fibers 121 to 124 are arranged between the first to third conductive lines 111 to 113 and the fourth to sixth conductive lines 114 to 116 in a lateral direction of the first substrate 10.

The front laminated layer 101 and the back laminated layer 102 are formed of, e.g., polyetherimide or polyethylene terephthalate. The first to fourth optical fibers 121 to 124 are, e.g., single-mode optical fibers but may be multi-mode optical fibers. The first to fourth optical fibers 121 to 124 have a diameter of, e.g., 90 μm.

In addition, as shown in FIGS. 1A to 2B, rectangular cutouts are formed at both end portions of the first substrate 10 and the pair of second substrates 20 are respectively arranged in the cutouts.

The second substrate 20 is a flexible printed-circuit board having flexibility, and has a mounting surface 20a on one side and a non-mounting surface 20b on another side. The optical device 31 and the semiconductor circuit element 32 are mounted on the mounting surface 20a while any electronic components are not mounted on the non-mounting surface 20b. In addition, the second substrate 20 has a plate-like base 21 formed of an insulating resin such as polyimide, plural wiring patterns 22 provided on a first principal surface 21a on the mounting surface 20a side of the base 21 and plural wiring patterns 23 provided on a second principal surface 21b on the non-mounting surface 20b side of the base 21. The base 21 has a thickness of, e.g., 100 μm.

The wiring patterns 22 and 23 are formed of a conductive material film. The wiring patterns 22 and 23 have a three-layer structure composed of, e.g., a copper (Cu) layer on the base 21, a nickel (Ni) plating layer formed on the copper layer and a gold (Au) plating layer to be the outermost surface formed on the nickel layer.

Meanwhile, card-edge connector portions 200a and 200b are provided at an edge of the second substrate 20. The card-edge connector portion 200a located on the mounting surface 20a side is a portion of the wiring pattern 22, and the card-edge connector portion 200b located on the second principal surface 21b side is a portion of the wiring pattern 23. The card-edge connector portion 200a located on the mounting surface 20a side is electrically connected to the card-edge connector portion 200b located on the second principal surface 21b side via a through-hole penetrating the base 21. The card-edge connector portions 200a and 200b are attachable to and detachable from a non-illustrate other connector. In addition, it is possible to directly solder the card-edge connector portions 200a and 200b to an electrode formed on another printed-circuit board.

The optical device 31 is an element which transmits or receives an optical signal. An example of the former includes a light-emitting element such as semiconductor laser element or LED (light-emitting diode). Meanwhile, an example of the latter includes a light-receiving element such as photodiode. The optical device 31 is configured such that light exits from or is incident on a light emitting/receiving portion formed on a surface facing the second substrate 20.

In the present embodiment, one optical device 31 is mounted on each of the pair of second substrates 20 such that the optical device 31 mounted on one of the second substrates 20 is a light-emitting element and the optical device 31 mounted on another second substrate 20 is a light-receiving element. Meanwhile, the semiconductor circuit element 32 mounted on the one of the second substrates 20 is a driver IC for operating the optical device 31, and the semiconductor circuit element 32 mounted on the other second substrates 20 is a preamplifier IC for amplifying a signal which is input from the optical device 31.

The semiconductor circuit element 32 has plural electrodes 321 on a surface opposite to the surface facing the mounting surface 20a. The electrodes 321 are respectively connected to the wiring patterns 22 around the semiconductor circuit element 32 by non-illustrated bonding wires.

Following is an explanation for the case where the optical device 31 mounted on one of the second substrates 20 is a VCSEL (Vertical Cavity Surface Emitting Laser) array for transmitting an optical signal and the optical device 31 mounted on the other second substrate 20 is a photodiode array for receiving an optical signal, however, it is not limited thereto and plural optical devices 31 may be mounted each second substrate 20 such that some optical devices 31 are VCSELs and other optical devices 31 are photodiodes. In this case, it is possible to perform bi-directional optical communication by the photoelectric composite wiring module 1. In other words, the photoelectric composite wiring module 1 is configured such that the optical devices 31 located on one end side of the first to fourth optical fibers 121 to 124 transmit optical signals and the optical devices 31 located on another end side receive optical signals. Furthermore, it may be configured such that the optical device 31 has a function capable of transmitting and receiving an optical signal at a different frequency from each other so as to allow bi-directional communication to be performed by one optical fiber.

First to sixth recessed portions 201 to 206 are formed on the second substrate 20 to respectively receive the first to sixth conductive lines 111 to 116 which protrude from the end portion of the first substrate 10. The first to sixth recessed portions 201 to 206 each have an opening on the mounting surface 20a of the second substrate 20 and are not open on the non-mounting surface 20b side. Meanwhile, the first to fourth optical fibers 121 to 124 protruding from the end portion of the first substrate 10 are held on the second substrate 20 by a rectangular parallelepiped-shaped hold-down member 30.

Next, a holding structure in which the first to sixth conductive lines 111 to 116 and the first to fourth optical fibers 121 to 124 protruding from the end portion of the first substrate 10 are held on the second substrate 20 will be described in detail.

Figure 4:
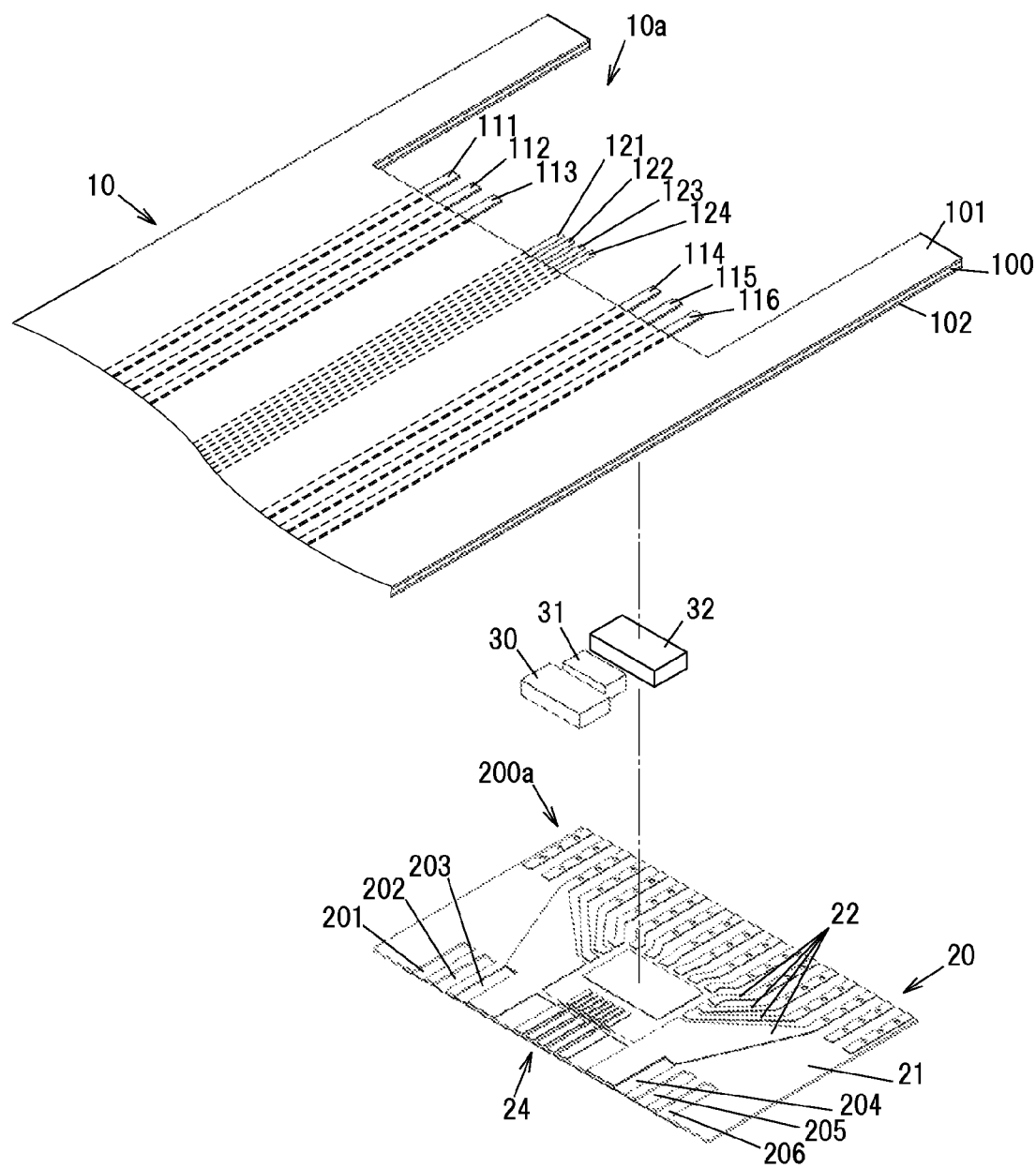
FIG. 4 is an exploded perspective view showing one end portion of the photoelectric composite wiring module.

FIG. 4 is an exploded perspective view showing one end portion of the photoelectric composite wiring module 1. Note that, another end portion of the photoelectric composite wiring module 1 is configured in the same manner.

A rectangular cutout 10a is formed on the end portion of the first substrate 10, and the tip portions of the first to sixth conductive lines 111 to 116 and of the first to fourth optical fibers 121 to 124 protrude in the cutout 10a. The protruding amount thereof is, e.g., 2 to 5 mm. The second substrate 20 is arranged in the position where the cutout 10a is formed. The first substrate 10 and the second substrate 20 are fixed to each other by, e.g., an adhesive.

An optical fiber holding portion 24 for holding the first to fourth optical fibers 121 to 124 is formed on the second substrate 20 between the first to third recessed portions 201 to 203 and the fourth to sixth recessed portions 204 to 206.

The second substrate 20 is inserted into the cutout 10a from the back side of the first substrate 10 (from the back laminated layer 102 side), and the first to sixth conductive lines 111 to 116 protruding from the first substrate 10 are received in the first to sixth recessed portions 201 to 206 at the time of the insertion. Alternatively, the first to sixth conductive lines 111 to 116 may be received in the first to sixth recessed portions 201 to 206 by moving the second substrate 20 parallel with respect to the first substrate 10.

Meanwhile, the optical device 31 and the semiconductor circuit element 32 may be mounted on the mounting surface 20a either before the second substrate 20 is inserted into the cutout 10a or after the second substrate 20 is inserted into the cutout 10a and is fixed to the first substrate 10.

Figure 5:
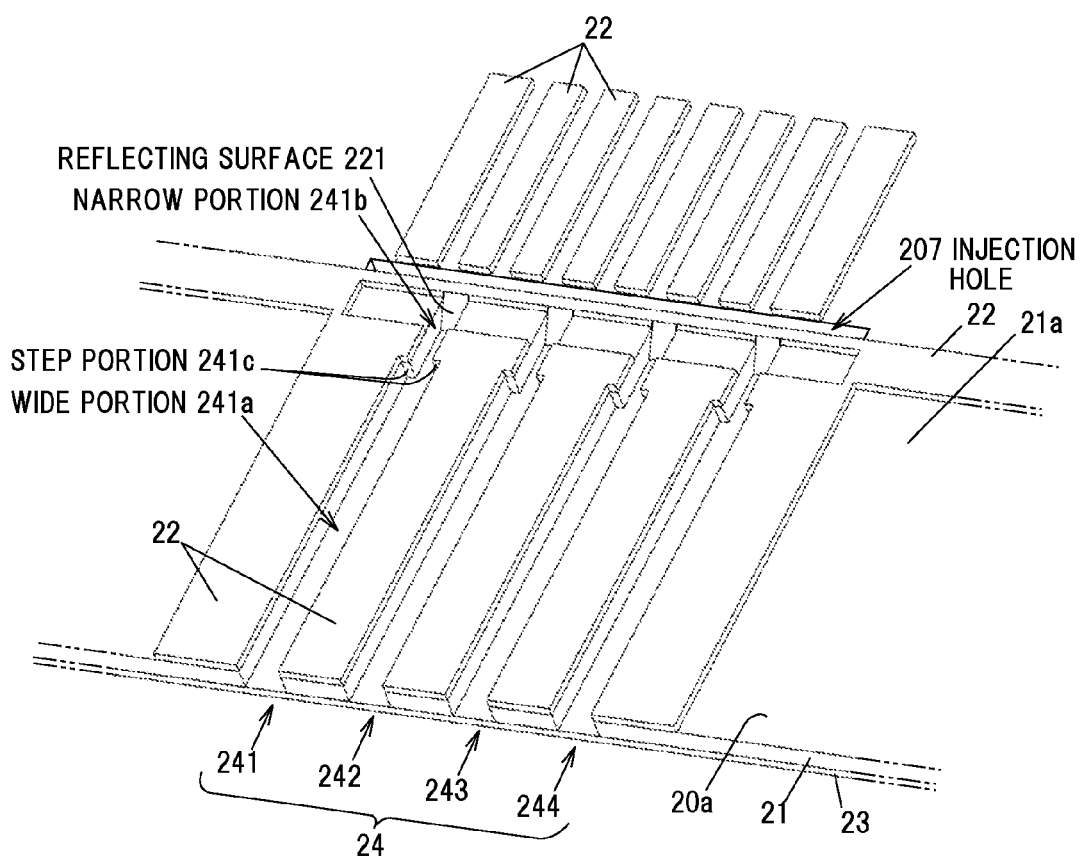
FIG. 5 is an enlarged view showing an optical fiber holding portion of a second substrate and a periphery thereof.

FIG. 5 is an enlarged view showing the optical fiber holding portion 24 of the second substrate 20 and a periphery thereof.

The optical fiber holding portion 24 is composed of first to fourth optical fiber receiving recesses 241 to 244 which respectively receive the first to fourth optical fibers 121 to 124. The first to fourth optical fiber receiving recesses 241 to 244 each have an opening on the mounting surface 20a of the second substrate 20 and are not open on the non-mounting surface 20b side.

In more detail, the first to fourth optical fiber receiving recesses 241 to 244 are formed so as to penetrate the base 21 in a thickness direction of the second substrate 20 from the first principal surface 21a to second principal surface 21b, and the bottom portions are blocked by the wiring pattern 23. In a region where the first to fourth optical fiber receiving recesses 241 to 244 are formed, the wiring pattern 22 on the mounting surface 20a side is removed and it is thus possible to receive the first to fourth optical fibers 121 to 124 in the first to fourth optical fiber receiving recesses 241 to 244 from the mounting surface 20a side.

In other words, when the second substrate 20 is inserted into the cutout 10a of the first substrate 10, the first to sixth conductive lines 111 to 116 protruding from the first substrate 10 are received in the first to sixth recessed portions 201 to 206 and, at the same time, the first to fourth optical fibers 121 to 124 protruding from the first substrate 10 are received in the first to fourth optical fiber receiving recesses 241 to 244.

Since the first to fourth optical fiber receiving recesses 241 to 244 have the same structure, the structure of the first optical fiber receiving recess 241 will be described in more detail as an example. The first optical fiber receiving recess 241 is formed having a width matching an outer diameter of the first optical fiber 121, and has a wide portion 241a for receiving the first optical fiber 121 and a narrow portion 241b formed having a width narrower than the outer diameter of the first optical fiber 121. A step portion 241c corresponding to a difference between the width of the wide portion 241a and that of the narrow portion 241b is formed between the wide portion 241a and the narrow portion 241b.

It is desirable that the width of the wide portion 241a be equivalent to the outer diameter of the first optical fiber 121 so that the first optical fiber 121 is received in the wide portion 241a without clearance. Meanwhile, it is desirable that the width of the narrow portion 241b be, e.g., 20 to 80% of the width of the wide portion 241a so that the first optical fiber 121 cannot be substantially received inside the narrow portion 241b.

A reflecting surface 221 inclined with respect to the first principal surface 21a is formed on the base 21 at one end of the narrow portion 241b (an end portion opposite to the step portion 241c). When light is emitted from the first optical fiber 121 which is received in the wide portion 241a, the reflecting surface 221 reflects the light towards the optical device 31. When light is emitted from the optical device 31, the reflecting surface 221 reflects the light towards the first optical fiber 121. Accordingly, the optical device 31 and the first optical fiber 121 are optically coupled by the reflecting surface 221. The reflecting surface 221 is formed in each of the second to fourth optical fiber receiving recesses 242 to 244 in the same manner, and the optical device 31 is thereby optically coupled to the second to fourth optical fibers 122 to 124.

In addition, an injection hole 207 through which an adhesive for fixing the optical device 31 to the second substrate 20 is injected is formed on the base 21 at a position facing the optical device 31. In the present embodiment, the injection hole 207 is formed in a groove shape which extends in a direction orthogonal to an extending direction of the first to fourth optical fiber receiving recesses 241 to 244.

The injection hole 207 is desirably formed to penetrate the base 21 in a thickness direction but may not necessarily penetrate the base 21. In addition, the injection hole 207 is not limited to the groove shape and may be, e.g., a circular or polygonal recess formed on the first principal surface 21a.

Figure 6:
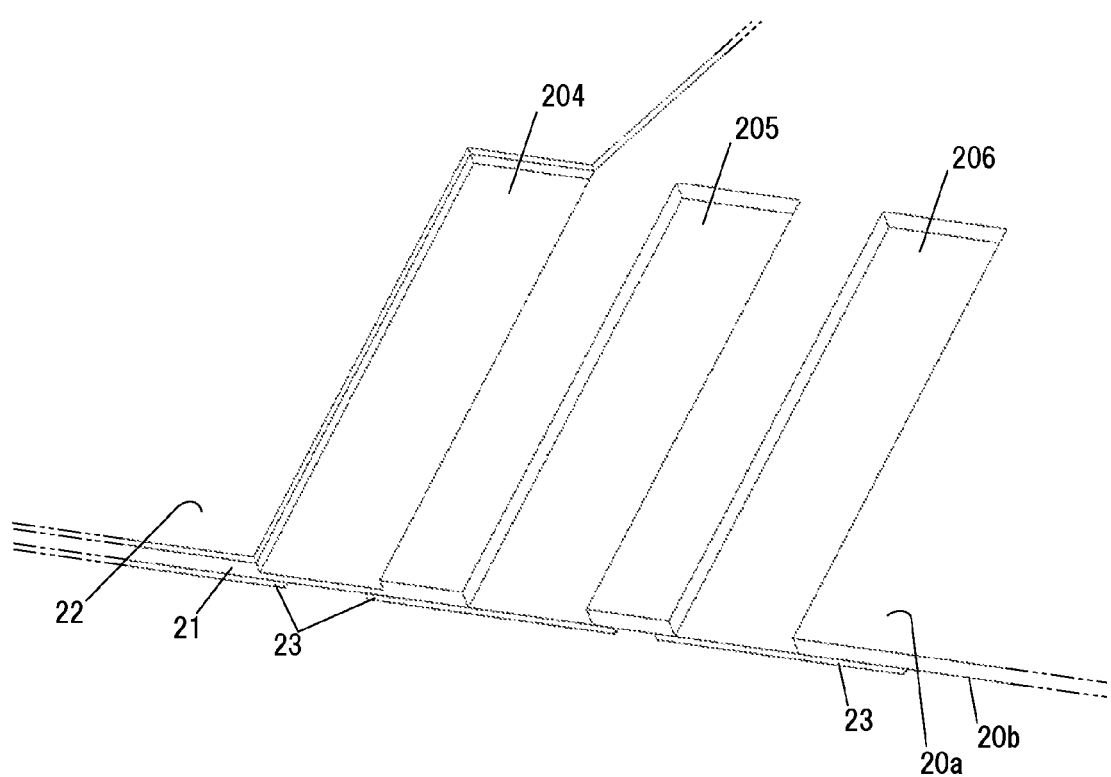
FIG. 6 is an enlarged view showing fourth to sixth recessed portions of the second substrate and a periphery thereof.

FIG. 6 is an enlarged view showing the fourth to sixth recessed portions 204 to 206 of the second substrate 20 and a periphery thereof. Here, the first to third recessed portions 201 to 203 and the fourth to sixth recessed portions 204 to 206 are symmetric.

The fourth recessed portion 204 is a recessed portion not penetrating the base 21 and is formed to open on the mounting surface 20a and to have a depth shallower than the thickness of the base 21. The fifth recessed portion 205 and the sixth recessed portion 206 are provided to penetrate the base 21 from the first principal surface 21a to the second principal surface 21b, and are formed to open on the mounting surface 20a while bottom portions thereof are blocked by the wiring pattern 23.

The fourth conductive line 114 received in the fourth recessed portion 204 is electrically connected to the wiring pattern 22 around the fourth recessed portion 204 by, e.g., soldering. The fifth conductive line 115 and the sixth conductive line 116 received in the fifth recessed portion 205 and the sixth recessed portion 206 are electrically connected to the wiring pattern 23 blocking the bottom portions of the fifth recessed portion 205 and the sixth recessed portion 206 by, e.g., soldering. End portions of the wiring patterns 22 and 23 to which the fourth to sixth conductive lines 114 to 116 are connected constitute the card-edge connector portions 200a and 200b (see FIGS. 1A to 2B). The first to third conductive lines 111 to 113 are configured in the same manner.

Figure 7:
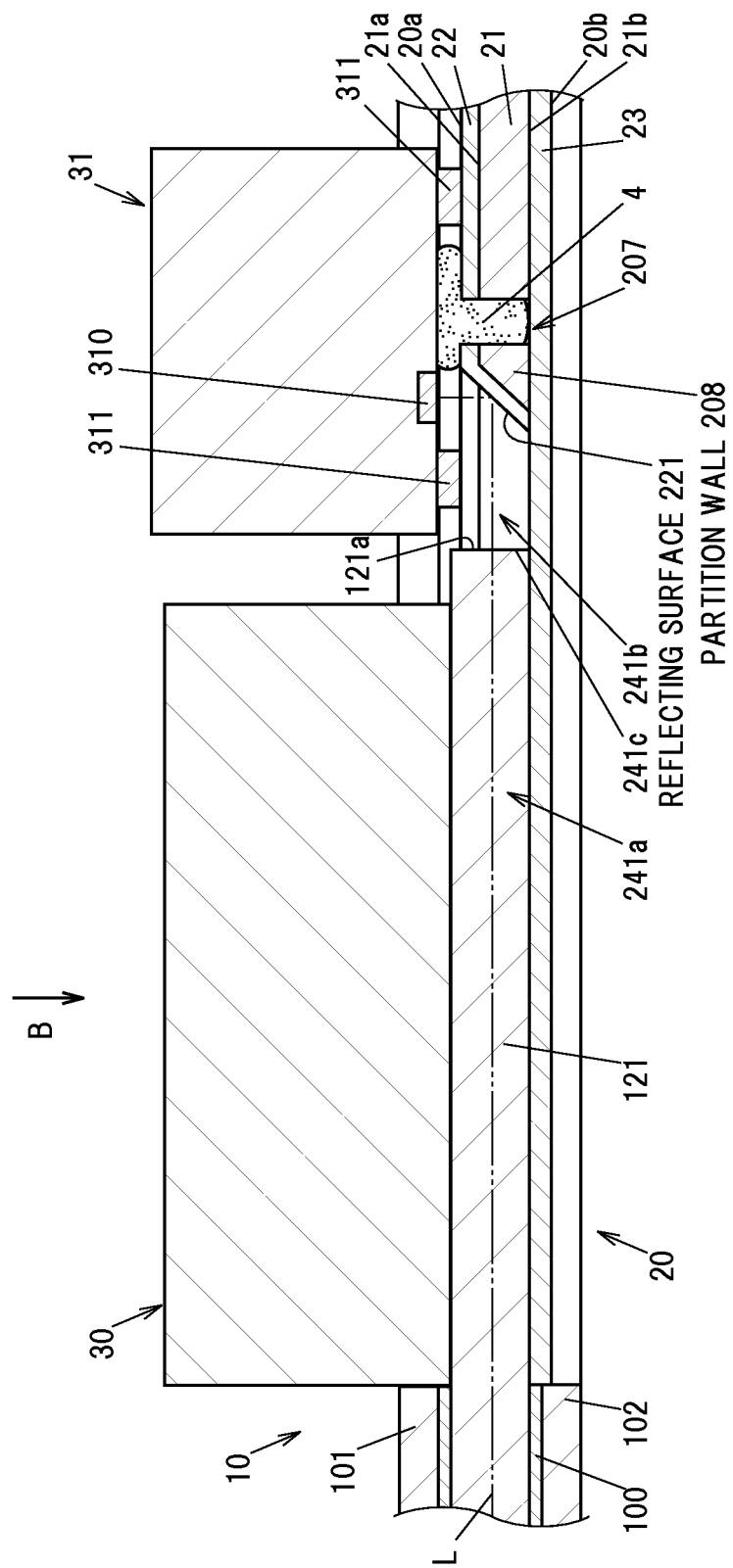
FIG. 7 is a principal-portion enlarged view showing a cross section of the photoelectric composite wiring module taken along a first optical fiber receiving recess.

FIG. 7 is a principal-portion enlarged view showing a cross section of the photoelectric composite wiring module 1 taken along the first optical fiber receiving recess 241.

The first optical fiber 121 which is received in the wide portion 241a of the first optical fiber receiving recess 241 is configured such that an end face 121a faces the step portion 241c. A metal film having the same layer structure as the wiring pattern 22 (Cu—Ni—Au) is formed on the reflecting surface 221. Optical reflectivity is enhanced by the metal film as compared to the case where the base 21 is exposed on the reflecting surface. In the present embodiment, the wiring pattern 22 on the mounting surface 20a side is electrically connected to the wiring pattern 23 on the non-mounting surface 20b side by the metal film on the reflecting surface 221.

The optical device 31 has plural terminals 311 which are soldered to the wiring pattern 22. In addition, the optical device 31 has a light emitting/receiving portion 310 on the surface facing the mounting surface 20a. When the optical device 31 is a light-emitting element (VCSEL array), light emitted from the light emitting/receiving portion 310 is reflected by the reflecting surface 221, is incident on the first optical fiber 121 from the end face 121a and propagates in the first optical fiber 121 toward another second substrate 20. In FIG. 7, a light path L of this light is indicated by a chain double-dashed line. Four light emitting/receiving portions 310 are provided on the optical device 31 so as to respectively correspond to the first to fourth optical fibers 121 to 124.

Meanwhile, when the optical device 31 is a light-receiving element (photodiode array), light emitted from the end face 121a of the first optical fiber 121 travels in a straight line in the narrow portion 241b, is reflected by the reflecting surface 221 and is incident on the light emitting/receiving portion 310 of the optical device 31.

The optical device 31 is fixed to the second substrate 20 by an adhesive 4 injected into the injection hole 207. The adhesive 4 partially comes out of the injection hole 207 so as to be interposed between the wiring pattern 22 and the optical device 31. The adhesive 4 has translucency to light having a wavelength propagating in the first to fourth optical fibers 121 to 124.

The injection hole 207 is separated from the first optical fiber receiving recess 241 (the narrow portion 241b) by a partition wall 208. The partition wall 208 is a portion of the base 21 and has the reflecting surface 221 on the first optical fiber receiving recess 241 side. Flow of the adhesive 4 into the narrow portion 241b is suppressed by the partition wall 208.

Meanwhile, as shown in FIG. 7, the step portion 241c of the first optical fiber receiving recess 241 is formed outside of a region for mounting the optical device 31 (outside of a region covered by the optical device 31 when the second substrate 20 is viewed from a normal direction of the mounting surface 20a). In other words, the position of the step portion 241c is determined so that the first optical fiber 121 does not enter between the optical device 31 and the wiring pattern 23.

The hold-down member 30 presses the first optical fiber 121 received in the wide portion 241a of the first optical fiber receiving recess 241 toward the bottom portion (toward the wiring pattern 23). Likewise, the second to fourth optical fibers 122 to 124 are also pressed by the hold-down member 30 so as not to slip out from the second to fourth optical fiber receiving recesses 242 to 244. The hold-down member 30 is fixed to the mounting surface 20a of the second substrate 20 by, e.g., a non-illustrated adhesive.

In addition, the hold-down member 30 is formed of a resin having translucency to visible light, such as polyimide, thereby allowing the first optical fiber receiving recess 241 to be visually seen from a normal direction of the mounting surface 20a (a direction indicated by an arrow B in FIG. 7) in a state of being fixed to the mounting surface 20a.

Next, an example of a method of manufacturing the second substrate 20 will be described. It should be noted that this manufacturing method is shown as one of methods of embodying the second substrate 20 according to the present embodiment and the second substrate 20 can be obtained by other manufacturing methods.

A brief summary of the method of manufacturing the second substrate 20 is as follows. That is, the process of manufacturing the second substrate 20 includes a first step of forming a first copper layer on the entire first principal surface 21a of the base 21, a second step of removing a portion of the first copper layer on the first principal surface 21a by etching, a third step of radiating laser beam on the base 21 to form the first to sixth recessed portions 201 to 206, the first to fourth optical fiber receiving recesses 241 to 244 and the injection hole 207 on the base 21 in a region where the first copper layer is removed, a fourth step of forming a second copper layer on the entire surface on the first principal surface 21a side, a fifth step of joining a thin copper plate to the second principal surface 21b of the base 21, a sixth step of etching the first and second copper layers and the thin copper plate into a predetermined shape, and a seventh step of forming a nickel plating layer and a gold plating layer on the second copper layer and the thin copper plate.

Each step will be described in more detail. In the first step, the first copper layer is formed on the entire first principal surface 21a by adhesion, deposition or non-electrolytic plating, etc. In the second step, a resist film is formed on the first copper layer formed in the first step except on a portion on which the first to sixth recessed portions 201 to 206, the first to fourth optical fiber receiving recesses 241 to 244 and the injection hole 207 are formed, and the first copper layer in a portion not having the resist film is removed by etching.

In the third step, laser beam (excimer laser or UV laser (ultraviolet laser)) is radiated from the first principal surface 21a side of the base 21 at an angle corresponding to an inclined angle of the reflecting surface 221 to form the first to sixth recessed portions 201 to 206, the first to fourth optical fiber receiving recesses 241 to 244 and the injection hole 207. In the fourth step, the second copper layer is formed on the entire first principal surface 21a including a portion to be the reflecting surface 221 by adhesion, deposition or non-electrolytic plating, etc.

In the fifth step, the thin copper plate is joined to the second principal surface 21b of the base 21 by, e.g., adhesion. In the sixth step, a resist film is formed on the second copper layer and the thin copper plate so as to correspond to the shapes of the wiring patterns 22 and 23 to be formed on the mounting surface 20a and the non-mounting surface 20b and etching is then performed, thereby processing the first and second copper layers and the thin copper plate into the shapes of the wiring patterns 22 and 23.

Then, in the seventh step, the nickel plating layer and the gold plating layer are formed on the second copper layer and the thin copper plate. As a result, the second substrate 20 having the wiring patterns 22, 23, the reflecting surface 221, the first to sixth recessed portions 201 to 206, the first to fourth optical fiber receiving recesses 241 to 244 and the injection hole 207 formed thereon is obtained.

Functions and Effects of the Embodiment

Following functions and effects are obtained by the present embodiment.

(1) Since the first to sixth recessed portions 201 to 206 and the first to fourth optical fiber receiving recesses 241 to 244 each have an opening on the mounting surface 20a of the second substrate 20, work of receiving and fixing the first to sixth conductive lines 111 to 116 into the first to sixth recessed portions 201 to 206, work of receiving and fixing the first to fourth optical fibers 121 to 124 in the first to fourth optical fiber receiving recesses 241 to 244 and work of mounting the optical device 31 and the semiconductor circuit element 32 can be carried out from the mounting surface 20a side of the second substrate 20. In addition, when the optical device 31, the semiconductor circuit element 32, the hold-down member 30 and a periphery thereof are molded, it is possible to perform this work from the mounting surface 20a side. As a result, it is possible to reduce man-hours for assembling the photoelectric composite wiring module 1.

(2) Since the reflecting surface 221 is formed on one end of each of the first to fourth optical fiber receiving recesses 241 to 244, it is possible to optically couple the first to fourth optical fibers 121 to 124 to the optical device 31 without increasing the thickness of the second substrate 20. In addition, since it is not necessary to provide a groove-shaped reflective portion on the back side of the region mounting the light-emitting element (VCSEL array) unlike JP-A 2011-53269 which provides the reflective portion, it is possible to smoothly bend the second substrate 20 without concentration of bending stress to the reflective portion.

(3) The fifth recessed portion 205 and the sixth recessed portion 206 are formed to penetrate the base 21, and the fifth conductive line 115 and the sixth conductive line 116 received in the recessed portions 205 and 206 are connected to the wiring pattern 23 located on the non-mounting surface 20b side. The first conductive line 111 and the second conductive line 112 received in the first recessed portion 201 and the second recessed portion 202 are configured in the same manner. Since this allows the wiring patterns (the wiring patterns 22 and 23) to be provided on both surfaces (the mounting surface 20a and the non-mounting surface 20b) of the second substrate 20, it is possible to reduce an area of the second substrate 20 as compared to the case where, e.g., the wiring patterns are provided only on the mounting surface 20a of the second substrate 20, which allows the photoelectric composite wiring module 1 to be downsized.

(4) Since the injection hole 207 for injecting the adhesive 4 is formed on the base 21, flow of the adhesive 4 into the first to fourth optical fiber receiving recesses 241 to 244 is suppressed. In other words, although the adhesive 4 flows along the mounting surface 20a when the adhesive 4 is dropped from the mounting surface 20a side and the optical device 31 is then mounted, an excess adhesive 4 partially flows into the injection hole 207 and the amount thereof flowing into the first to fourth optical fiber receiving recesses 241 to 244 is reduced. Accordingly, it is possible to prevent the adhesive 4 from flowing into the first to fourth optical fiber receiving recesses 241 to 244 and from precluding the reception of the first to fourth optical fibers 121 to 124 in the first to fourth optical fiber receiving recesses 241 to 244.

(5) Since the step portions of the first to fourth optical fiber receiving recesses 241 to 244 are formed outside of the region for mounting the optical device 31, the first to fourth optical fibers 121 to 124 do not get under the optical device 31 (on the wiring pattern 23 side). As a result, the optical device 31 is not pushed up in a direction of separating from the mounting surface 20a by the first to fourth optical fibers 121 to 124 even when the tip portions of the first to fourth optical fibers 121 to 124 are bent, and it is thus possible to surely solder the terminals 311 of the optical device 31 to the wiring pattern 22. In addition, the base 21 can be formed thinner than the diameter of the first to fourth optical fibers 121 to 124, and it is thus possible to thin the second substrate 20.

(6) Since the hold-down member 30 allows the first to fourth optical fiber receiving recesses 241 to 244 to be visually seen from a normal direction of the mounting surface 20a in a state of being fixed to the mounting surface 20a, it is possible to visually confirm whether the first to fourth optical fibers 121 to 124 are surely received in the first to fourth optical fiber receiving recesses 241 to 244 even after fixing the hold-down member 30.

Although the embodiment of the invention has been described, the invention according to claims is not to be limited to the above-mentioned embodiment. Further, please note that all combinations of the features described in the embodiment are not necessary to solve the problem of the invention.

What is claimed is:

1. A photoelectric composite wiring module, comprising:
   a flexible first substrate comprising a conductive line and an optical fiber mounted thereon along a longitudinal direction thereof;
   a second substrate comprising a recessed portion formed on a surface of a mounting side to receive the conductive line and the optical fiber that protrude from an end portion of the first substrate; and
   an optical device mounted directly on the surface of the mounting side of the second substrate and optically coupled to the optical fiber,
   wherein the recessed portion comprises an opening on the surface of the mounting side of the second substrate to mount the optical device, and
   wherein the first flexible substrate has a larger width than the second substrate along a direction transverse to the longitudinal direction of the conductive line and optical fiber,
   wherein the second substrate comprises a base formed of an insulating resin and having the recessed portions formed thereon and wiring patterns provided on a first principal surface of the base on the mounting side and on a second principal surface opposite to the first principal surface, and
   wherein the conductive line comprises a plurality of conductive lines, and wherein at least one of the plurality of the conductive lines is received in the recessed portion penetrating the base from the first principal surface to the second principal surface and is electrically connected to the wiring pattern on the second principal surface side.

2. The photoelectric composite wiring module according to claim 1, wherein the base comprises a reflecting surface inclined relative to the first principal surface at an edge of the recessed portion receiving the optical fiber, and wherein the optical fiber is optically coupled to the optical device through the reflecting surface.

3. The photoelectric composite wiring module according to claim 2, wherein the base further comprises an injection hole for injecting an adhesive to fix the optical device to the second substrate, and wherein the injection hole is separated from the recessed portion by a partition wall having the reflecting surface.

4. The photoelectric composite wiring module according to claim 1, wherein the recessed portion comprises a wide portion having a width matching an outer diameter of the optical fiber and a narrow portion having a width narrower than the outer diameter of the optical fiber, and wherein a step portion between the wide portion and the narrow portion is formed on the surface of the mounting side outside of a region for mounting the optical device.

5. The photoelectric composite wiring module according to claim 4, further comprising: a hold-down member fixed to the surface of the mounting side of the second substrate to hold-down the optical fiber that is received in the wide portion of the recessed portion, wherein the hold-down member has translucency allowing the recessed portion to be visible from a position in a normal direction of the mounting surface while being fixed to the mounting surface.

6. The photoelectric composite wiring module according to claim 1, wherein the flexible first substrate has a mounting surface having a substantially larger area than the area of the surface of the mounting side of the second substrate.

7. The photoelectric composite wiring module according to claim 2, wherein the flexible first substrate has a mounting surface having a substantially larger area than the area of the surface of the mounting side of the second substrate.

8. The photoelectric composite wiring module according to claim 2, wherein the flexible first substrate has a cut-out section at one end for receiving and supporting the second substrate.

9. The photoelectric composite wiring module according to claim 1, wherein the recessed portion for receiving the optical fiber penetrates the base from the first principal surface to the second principal surface, and a bottom portion of the recessed portion is blocked by the wiring pattern.

10. The photoelectric composite wiring module according to claim 1, wherein the at least one of a plurality of conductive lines received in the recessed portion penetrating the base extends past an edge of the flexible first substrate.

* * * * *